(12) United States Patent
Mangeot

(10) Patent No.: US 11,165,369 B2
(45) Date of Patent: Nov. 2, 2021

(54) PRE-LOADED PIEZOELECTRIC STACK ACTUATOR

(71) Applicant: CTS Corporation, Lisle, IL (US)

(72) Inventor: Charles E. Mangeot, Copenhagen (DK)

(73) Assignee: CTS Corporation, Lisle, IL (US)

( * ) Notice: Subject to any disclaimer, the term of this patent is extended or adjusted under 35 U.S.C. 154(b) by 411 days.

(21) Appl. No.: 16/246,644

(22) Filed: Jan. 14, 2019

(65) Prior Publication Data

US 2019/0222146 A1 Jul. 18, 2019

Related U.S. Application Data

(60) Provisional application No. 62/617,436, filed on Jan. 15, 2018.

(51) Int. Cl.
*H02N 2/04* (2006.01)
*F16F 1/02* (2006.01)
*H01L 41/053* (2006.01)
*H02N 2/00* (2006.01)
*H02N 2/06* (2006.01)

(52) U.S. Cl.
CPC ............ *H02N 2/043* (2013.01); *F16F 1/027* (2013.01); *H01L 41/0536* (2013.01); *H02N 2/006* (2013.01); *H02N 2/067* (2013.01)

(58) Field of Classification Search
CPC ............................ H01L 41/0536; F16F 1/027
See application file for complete search history.

(56) References Cited

U.S. PATENT DOCUMENTS

| 6,172,445 | B1 | 1/2001 | Heinz et al. |
| 6,274,967 | B1 | 8/2001 | Zumstrull et al. |
| 6,984,924 | B1 | 1/2006 | Voigt et al. |
| 6,998,761 | B1 | 2/2006 | Frank et al. |

(Continued)

FOREIGN PATENT DOCUMENTS

| DE | 10310787 A1 | 9/2004 |
| DE | 10319586 A1 | 11/2004 |

(Continued)

OTHER PUBLICATIONS

Piezosystem Jena GmbH: "Multilayer Stack Type Actuators", 2019 www.piezosystem.com/products/piezo_actuators/stacktypeactuators/.

(Continued)

*Primary Examiner* — Emily P Pham
(74) *Attorney, Agent, or Firm* — Daniel Deneufbourg

(57) ABSTRACT

A pre-loaded piezoelectric stack actuator comprising a stack of piezoelectric material. Caps are coupled at opposed ends of the stack. Each of the caps includes projecting fingers. Insulating plates are stacked between the ends of the stack and the caps. A pair of pre-loaded spring plates are coupled to the stack. The spring plates define slots. The fingers on the caps extend through respective ones of the slots at respective ends of the spring plates for coupling the spring plates to the stack. A method of pre-loading the piezoelectric stack actuator includes the step of mounting the stack, the caps, the insulating plates, and the spring plates in a pre-load tool that applies a pre-load tensile stretching force to the spring plates. The pre-load tensile force is subsequently released and the actuator is removed from the tool.

13 Claims, 4 Drawing Sheets

(56) References Cited

U.S. PATENT DOCUMENTS

| | | |
|---|---|---|
| 7,222,424 B2 | 5/2007 | Jovovic et al. |
| 7,339,308 B2 | 3/2008 | Boecking et al. |
| 7,420,316 B2 | 9/2008 | Kienzler et al. |
| 7,564,175 B2 | 7/2009 | Stier et al. |
| 7,765,877 B2 | 8/2010 | Venkataraghavan et al. |
| 7,841,320 B2 | 11/2010 | D'Arrigo |
| 7,859,169 B2 | 12/2010 | Stocker et al. |
| 7,950,596 B2 | 5/2011 | Venkataraghavan et al. |
| 7,997,145 B2 | 8/2011 | Venkataraghavan et al. |
| 8,100,346 B2 | 1/2012 | Venkataraghavan et al. |
| 9,627,604 B2 | 4/2017 | Hamann et al. |
| 2007/0090724 A1 | 4/2007 | Kato et al. |
| 2008/0231142 A1 | 9/2008 | Gottlieb et al. |
| 2009/0140610 A1* | 6/2009 | Venkataraghavan ............... H01L 41/0533 310/338 |
| 2014/0355093 A1* | 12/2014 | Goepel .................. H02N 2/10 359/221.2 |
| 2017/0167457 A1 | 6/2017 | Graves |

FOREIGN PATENT DOCUMENTS

| | | |
|---|---|---|
| DE | 10321695 A1 | 12/2004 |
| DE | 102005046178 B3 | 11/2006 |
| DE | 102005029471 A1 | 1/2007 |
| DE | 102005046269 A1 | 4/2007 |
| DE | 102005053076 A1 | 5/2007 |
| DE | 102005046440 B4 | 7/2007 |
| DE | 102005046174 B4 | 12/2008 |
| EP | 1500810 A1 | 1/2005 |
| JP | 2847596 B2 | 1/1999 |
| WO | 2003019688 | 3/2003 |
| WO | 2008009577 | 1/2008 |
| WO | 2008009578 | 1/2008 |

OTHER PUBLICATIONS

Cedrat Technologies: "PPA40L Piezoelectric Stack Actuator", 2014 www.cedrat-technologies.com.
PhysikInstrumente: "Preloaded Piezo Actuators", 2018 www.physikinstrumente.com.
NanoFaktur: "Product-Specification MPO-05 Piezo Stacks", 2017 www.nanoFaktur.com.
DSM Dynamic Structures & Materials, LLC: "NA-025-0518-150-SS FlexFrame PiezoActuator", 2019 www.dynamic-structures.com.

* cited by examiner

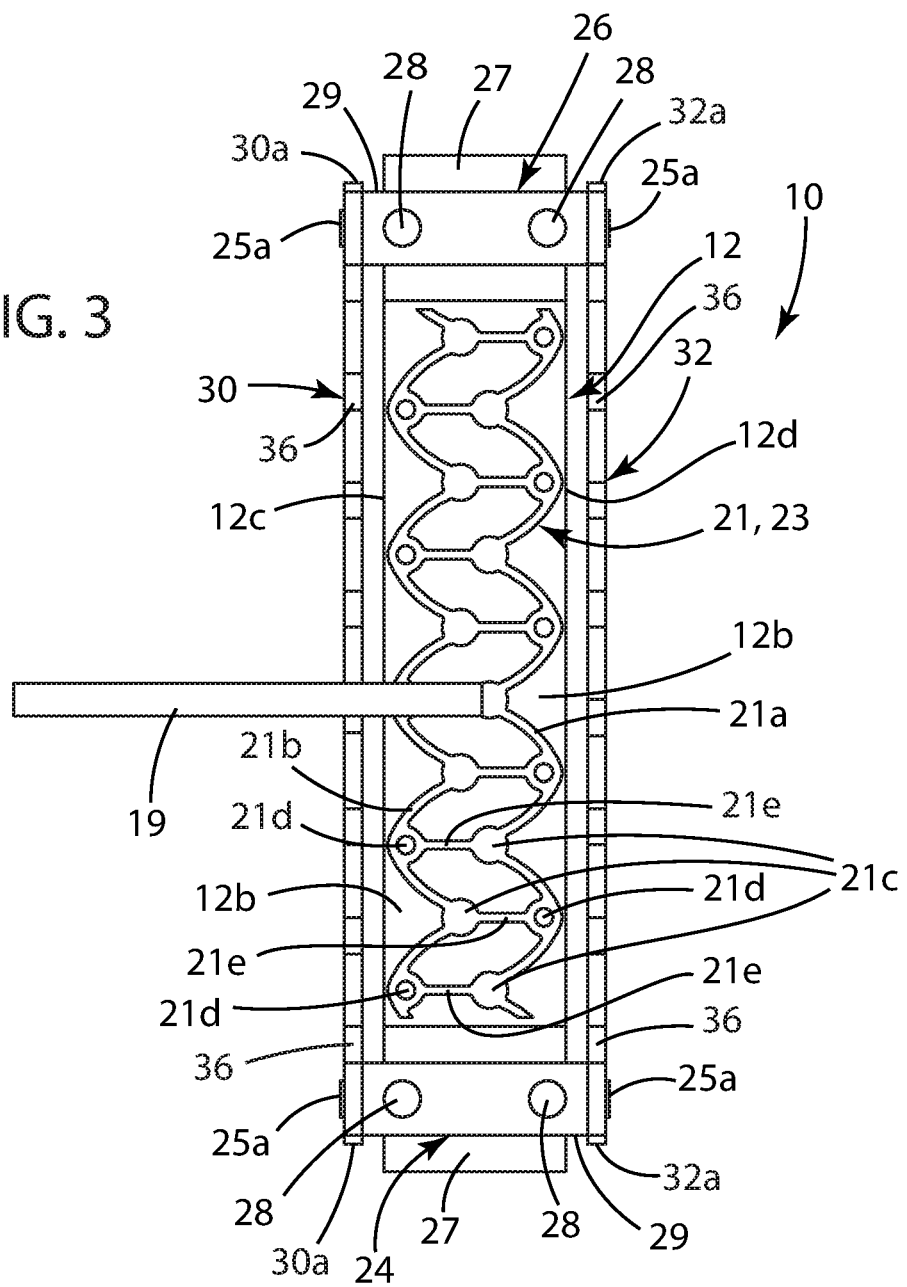

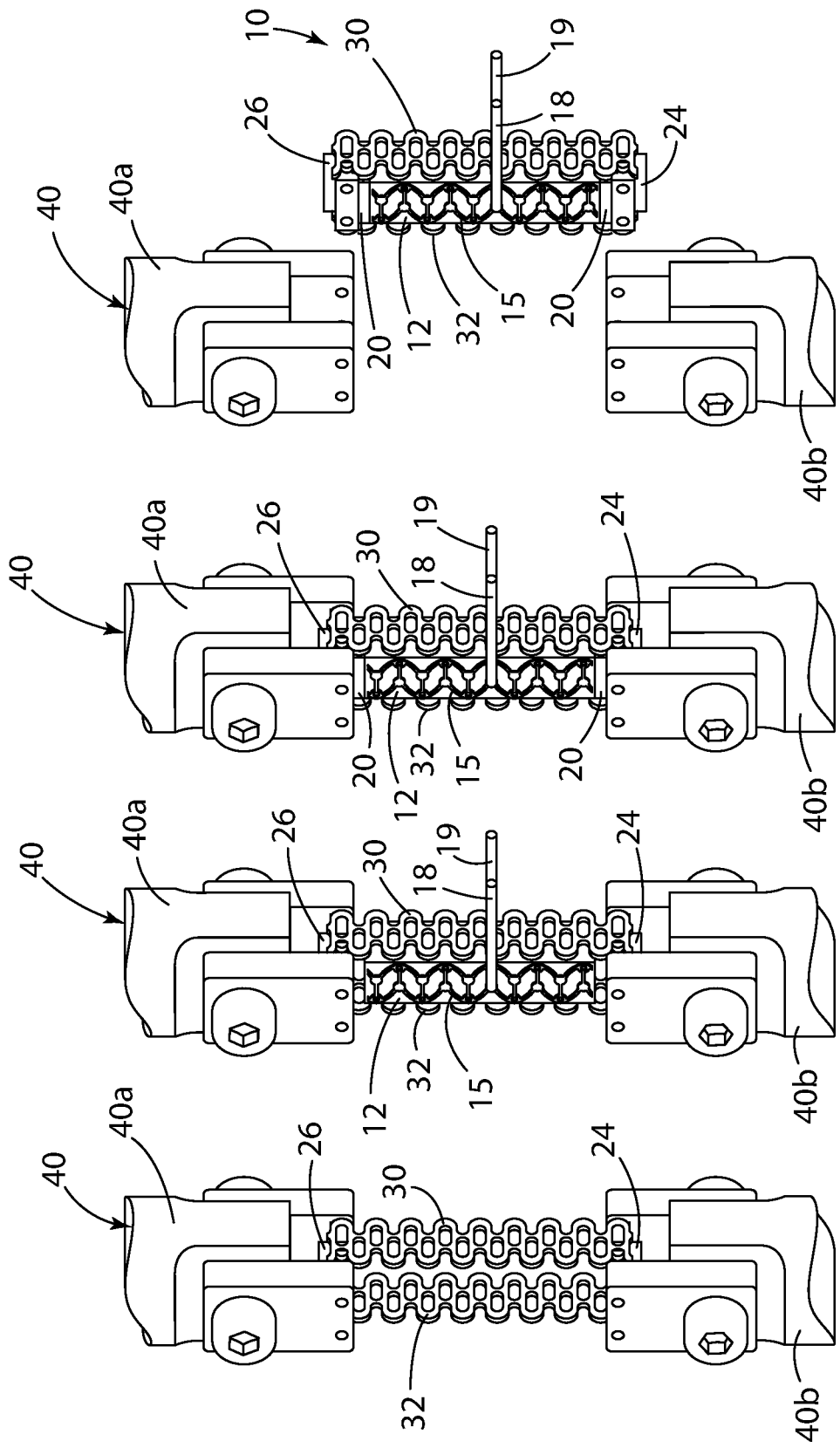

PRE-LOADED PIEZOELECTRIC STACK ACTUATOR

CROSS-REFERENCE TO RELATED APPLICATION

This patent application claims priority and benefit of the filing date of U.S. Provisional Patent Application Ser. No. 62/617,436 filed on Jan. 15, 2018, the disclosure and contents of which is expressly incorporated herein in its entirety by reference.

FIELD OF THE INVENTION

This invention relates generally to an actuator and, more specifically, to a pre-loaded piezoelectric stack actuator.

BACKGROUND OF THE INVENTION

Piezoelectric stack actuators are well known in the art and in most applications are intended to act on a load and, still more specifically, are intended and designed to push and pull on a load including, for example, applications where the actuator is used to shake a mass at high frequency, i.e., applications where the dynamic force (mass multiplied by acceleration) can be significant.

In these applications, the ceramic material that comprises the layers of the stack actuator can tolerate high levels of compressive stress but only a limited or small amount of tensile stress. Therefore, to widen the operating range of such actuators, it is advantageous to add a pre-stress/pre-load mechanism. The pre-stress/pre-load mechanism generates a "force bias" on the actuator that allows the actuator to both push a load (apply a compressive force) and pull at a load (apply a tensile force). Pre-loading an actuator also increases the performance (i.e., for example stiffness and displacement) of piezoelectric stack actuators.

There are several different designs of pre-loaded piezoelectric stack actuators available today. Some designs enclose the piezoelectric stack in a laser welded rigid tube, and the preload force is generated by a spring washer. Other designs use an elongated undulated or wave spring coupled to the piezoelectric stack.

All currently available piezoelectric actuator designs however require the manufacture of custom parts and, more specifically, the manufacture of tubes and/or spring washers matching the desired custom length of the stack of the piezoelectric stack actuator. The designs that use a spring washer also are subject to wear and variable results depending on the length of the stack. Designs that use a tube are also not adapted for smaller piezoelectric designs and cannot easily be disassembled.

The present invention is directed to a new and lower cost pre-loaded piezoelectric stack actuator.

SUMMARY OF THE INVENTION

The present invention is directed to a pre-loaded piezoelectric stack actuator comprising a piezoelectric stack, a first electrode on a first side of the piezoelectric stack, a second electrode on a second side of the piezoelectric stack opposite the first side of the piezoelectric stack, first and second end caps at opposed first and second ends of the piezoelectric stack, one or more first plates stacked between the first end cap and the first end of the piezoelectric stack, one or more second plates stacked between the second end cap and the second end of the piezoelectric stack, a first elongate pre-loaded spring plate on a third side of the piezoelectric stack and including opposed ends coupled to a first side of the first and second end caps, the first flat spring plate defining one or more slots, and a second elongate pre-loaded spring plate on a fourth side of the piezoelectric stack opposite the third side of the piezoelectric stack and including opposed ends coupled to a second side of the first and second end caps opposite the first side of the first and second end caps, the second flat spring plate defining one or more slots.

In one embodiment, each of the first and second spring plates defines a longitudinal axis and a column of a plurality of the slots extending along the longitudinal axis.

In one embodiment, each of the first and second end caps includes a finger on opposed exterior side faces thereof, the finger extending into the one of the slots located at each of the opposed ends of each of the first and second spring plates for coupling the first and second spring plates and the first and second end caps to the piezoelectric stack.

In one embodiment, each of the first and second spring plates includes a plurality of closed slots and open slots extending along the longitudinal axis thereof and each of the first and second end caps includes first and second fingers extending into one of the closed slots and one of the open slots respectively at each end of each of the first and second spring plates for coupling the first and second spring plates and the first and second end caps to the piezoelectric stack.

In one embodiment, the first and second fingers are positioned on the first and second flat spring plates in a spaced-apart and co-linear relationship and the one of the closed slots and the one of the open slots at each end of each of the first and second spring plates are positioned in a spaced-apart and co-linear relationship.

In one embodiment, each of the first and second spring plates defines a longitudinal axis and including first and second columns of closed slots and open slots extending along the longitudinal axis, the closed slots extending in a spaced-apart and vertical co-linear relationship relative to each other, the open slots in each of the first and second columns extending in a spaced-apart and vertical relationship relative to each other and in an alternating and spaced-apart relationship relative to the closed slots, and the closed slots in the first column extending in a side-by-side and horizontal co-linear relationship with the open slots in the second column.

The present invention is also directed to a pre-loaded piezoelectric stack actuator comprising a piezoelectric stack including opposed first and second exterior side faces, first and second end caps at opposed first and second end faces of the piezoelectric stack, each of the first and second end caps including a pair of first and second fingers projecting outwardly therefrom, a first elongate pre-stretched spring plate extending opposite the first exterior side face of the piezoelectric stack and defining first and second columns of closed and open slots, one of the pairs of the first and second fingers on each of the first and second end caps extending into respective ones of the closed and open slots defined at opposed ends of the first spring plate respectively for coupling the first spring plate to the first and second end caps, and a second elongate pre-stretched spring plate extending opposite the second exterior side face of the piezoelectric stack and defining first and second columns of closed and open slots, the other of the pairs of the first and second fingers on each of the first and second end caps extending into respective ones of the closed and open slots defined at opposed ends of the second spring plate respectively for coupling the first spring plate to the first and second end caps.

In one embodiment, first and second electrodes are formed on third and fourth exterior side faces of the stack of piezoelectric material.

In one embodiment, the first and second columns of closed slots and open slots extend along a longitudinal axis of the first and second spring plates, the closed slots and open slots in each of the first and second columns extending in an alternating, spaced-apart and vertical co-linear relationship relative to each other and perpendicular to the longitudinal axis of the first and second spring plates, and the closed slots in the first column extending in a side-by-side and horizontal co-linear relationship with the open slots in the second column.

The present invention is also directed to a method of pre-loading a piezoelectric stack actuator including a piezoelectric stack including opposed first and second ends, first and second caps, a plurality of insulative plates of equal or unequal thickness, and first and second spring plates each defining a plurality of slots, the method comprising the steps of providing a pre-load tool including opposed first and second ends, connecting the first and second caps to the first and second ends of pre-load tool, connecting the first and second spring plates between the first and second caps connected to the first and second ends of the pre-load tool, applying a tensile force to the opposed ends of the pre-load tool to stretch the first and second flat springs, inserting the piezoelectric stack into the pre-load tool between the first and second caps and the first and second flat spring plates, inserting one or more of the plurality of insulative plates between the first cap and a first end of the piezoelectric stack, inserting one or more of the plurality of insulative plates between the second cap and the second end of the piezoelectric stack, releasing the tensile force applied to the pre-load tool, and removing the piezoelectric stack actuator from the pre-load tool.

In one embodiment, each of the first and second caps includes a finger projecting from opposed exterior side faces thereof and the step of connecting the first and second spring plates to the first and second caps comprises the step of inserting the finger on the first and second end caps into respective ones of the plurality of slots in each of the first and second spring plates.

In one embodiment, each of the first and second caps includes a pair of first and second fingers projecting from the opposed exterior side faces thereof and the first and second spring plates include first and second columns of closed and open slots, the step of connecting the first and second spring plates to the first and second caps comprises the step of inserting the pairs of the first and second fingers on each of the first and second end caps extending into respective ones of the closed and open slots defined at opposed ends of the first and second spring plates respectively.

In one embodiment, the first and second columns of closed slots and open slots extend along the longitudinal axis of the first and second spring plates, the closed slots and open slots in each of the first and second columns extending in an alternating, spaced-apart and vertical co-linear relationship relative to each other, and the closed slots in the first column extending in a side-by-side and horizontal co-linear relationship with the open slots in the second column.

Other advantages and features of the present invention will be more readily apparent from the following detailed description of the preferred embodiment of the invention, the accompanying drawings, and the appended claims.

BRIEF DESCRIPTION OF THE DRAWINGS

These and other features of the invention can best be understood by the description of the accompanying FIGS. as follows:

FIG. 3 is an enlarged side elevational view of the piezoelectric stack actuator shown in FIG. 1; and FIGS. 4A, 4B, 4C, and 4D depict the process for applying a pre-load and for assembling the piezoelectric stack actuator shown in FIG. 1.

DESCRIPTION OF THE EMBODIMENT

Figure 1:
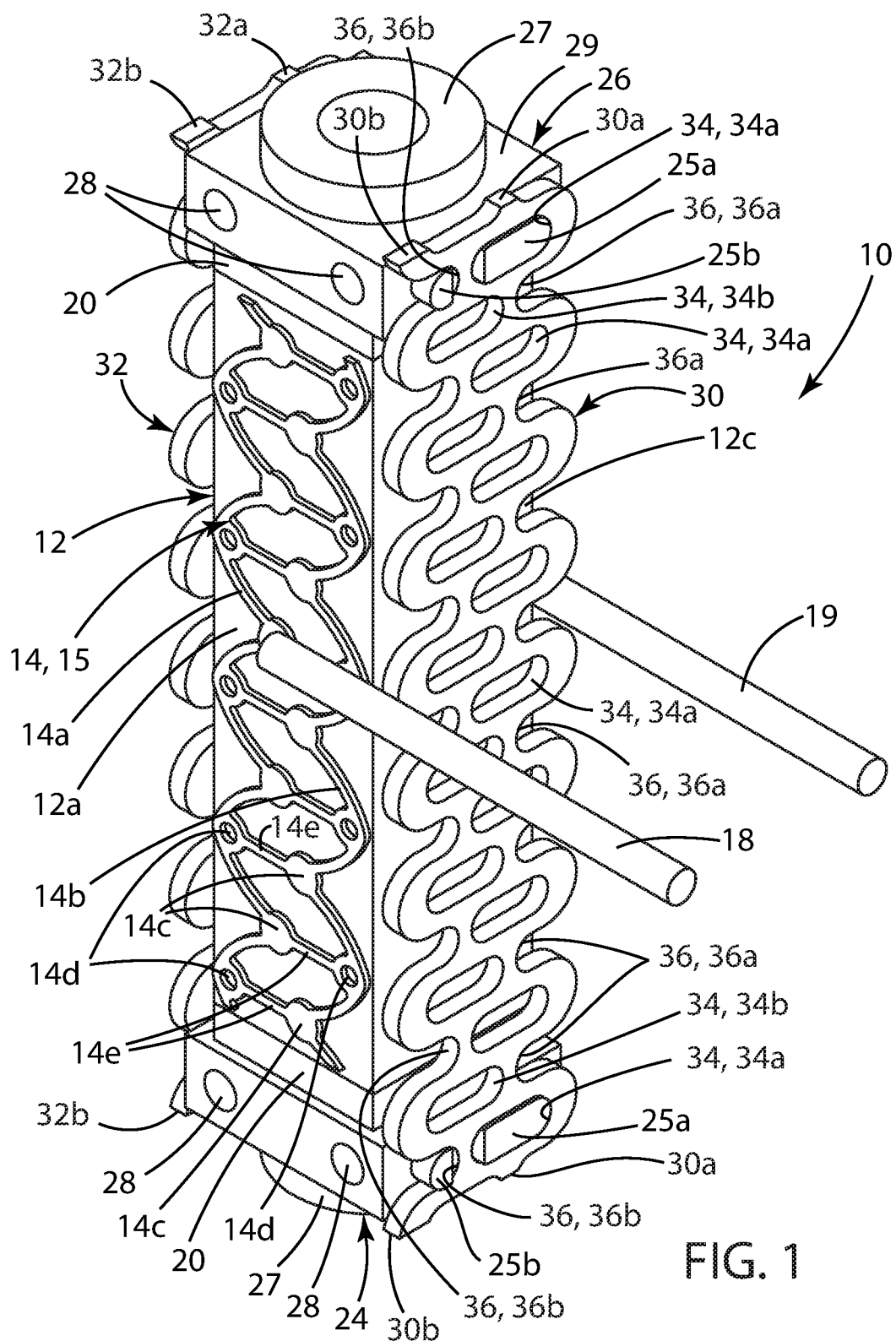
FIG. 1 is an enlarged perspective view of a pre-loaded piezoelectric stack actuator in accordance with the present invention.

FIGS. 1, 2, 3, and 4 depict a pre-loaded piezoelectric stack actuator 10 in accordance with the present invention which, in the embodiment shown, comprises a central elongated piezoelectric stack 12 composed of a plurality of monolithic tiles or chips or plates of piezoelectric material which have been stacked and then bonded together. The piezoelectric stack 12 can also be a one piece monolithic element.

In the embodiment shown, the stack 12 is a generally rectangular block of piezoelectric material that includes opposed exterior longitudinally extending vertical side faces 12a and 12b, opposed exterior longitudinally extending vertical side faces 12c and 12d between the side faces 12a and 12b, and opposed distal horizontal end faces 12e and 12f.

In the embodiment shown, an undulating pattern of suitable electrically conductive material 14 defines a bus-wire 15 that extends along the length of, and is formed and seated on the exterior longitudinal electrode surface 12a of the piezoelectric stack 12. A wire 18 is coupled to and extends outwardly from the bus-wire 15.

More particularly, in the embodiment shown, the bus-wire 15 is composed of first and second spaced-apart and generally parallel elongate undulating/sinusoidal shaped strips or segments 14a and 14b of conductive material extending along the length of the side face 12a in a relationship with the strip 14a located adjacent and extending along the first longitudinal edge of the side face 12a and the strip 14b located adjacent and extending along the second opposed longitudinal edge of the side face 12a.

Each of the strips 14a and 14b includes a plurality of generally circular beads 14c of conductive material extending along the side face 12a in a spaced-apart and staggered relationship relative to each other.

Each of the strips 14a and 14b also defines a plurality of generally circular apertures or openings 14d devoid of conductive material and extending along the length of the side face 12a in a spaced-apart and staggered relationship relative to each other and further in a relationship horizontally co-linear with respective ones of the beads 14c.

Additional cross-strips of conductive material 14e extend between and interconnect the strips 14a and 14b in a relationship with a bead 14c and an aperture 14d located and formed at opposed ends of each of the cross-strips 14e.

An identical undulating pattern of suitable electrically conductive material 21 defines an opposing bus-wire 23 that extends along the length of, and is formed and seated on the exterior longitudinal electrode surface 12b of the piezoelectric stack 12 located diametrically opposite the longitudinal exterior surface 12a. A wire 19 is coupled to and extends outwardly from the bus-wire 15. Thus, in the embodiment shown, the electrodes 15 and 23 are formed on the opposed side faces 12a and 12b of the stack 12.

More particularly, in the embodiment shown, the bus-wire 23, in a manner identical to the bus-wire 15, is composed of first and second spaced-apart and generally parallel elongate undulating/sinusoidal shaped strips or segments 21a and 21b of conductive material extending along the length of the side face 12b in a relationship with the strip 21a located adjacent and extending along the first longitudinal edge of the side face 12b and the strip 21b located adjacent and extending along the second opposed longitudinal edge of the side face 12b.

Each of the strips 21a and 21b includes a plurality of generally circular beads 21c of conductive material identical to the beads 14c. Each of the strips 21a and 21b also defines a plurality of generally circular apertures or openings 21d devoid of conductive material and identical to the apertures/openings 14d.

Additional cross-strips of conductive material 21e extend between and interconnect the strips 21a and 21b in a relationship with a bead 21c and an aperture 21d located and formed at opposed ends of each of the cross-strips 21e.

A pulsating electrical action on the opposing wires 18 and 19 causes the expansion and contraction of the piezoelectric stack 12 to push and pull on a load.

The piezoelectric stack actuator 10 also comprises inactive, insulating, non-conductive ceramic plates 20 which are located and stacked against the opposed distal end faces 12e and 12f of the stack 12. In the embodiment shown, the piezoelectric stack actuator 10 includes only one plate 20 stacked against each of the ends faces 12e and 12f although it is understood that no plates 20 or a plurality of plates 20 can be stacked against one or both of the end faces 12e and 12f of the stack 12 depending on the desired stack length and adjustment of the preload.

The piezoelectric stack actuator 10 further comprises a pair of generally square shaped end caps 24 and 26, typically composed of stainless steel and adapted to surround the end and the sides of the respective ceramic plates 20 at each of the ends 12e and 12f of the stack 12 and including structure in the form of, for example, a pair of outwardly protruding projections or fingers or tabs 25a and 25b formed on and protruding outwardly from opposed ones of the exterior side faces of each of the end caps 24 and 26 and defining respective mounting hooks or brackets or posts adapted for coupling the end caps 24 and 26 to the opposed distal ends of spring plates 30 and 32 as discussed in more detail below.

In the embodiment shown, the tabs 25a and 25b are positioned in a side-by-side, co-linear, and spaced apart relationship relative to each other with the tab 25a having a length greater than the tab 25b and shaped and sized respectively to complement the shape and size of the respective closed and open loops 34a and 34b defined on the respective spring plates 30 and 32 as discussed in more detail below.

Each of the end caps 24 and 26 also includes a pair of tool mounting apertures 28 defined in each of the opposed exterior side faces thereof located between the opposed exterior side faces thereof including the spring receiving hooks or fingers or tabs 25a and 25b.

Each of the end caps 24 and 26 further includes a circular collar 27 protruding outwardly from an exterior face 29 thereof.

The piezoelectric stack actuator 10 still further comprises a pair of elongated flat vertical spring plates 30 and 32 that are typically composed of a Copper-Beryllium alloy.

The spring plate 30 extends longitudinally along the length of, and opposite and spaced from and parallel to, the exterior longitudinal side face 12c of the piezoelectric stack 12.

The spring plate 32 extends along the length of, and opposite and spaced from and parallel to, the opposed longitudinal exterior side face 12d of the piezoelectric stack 12.

Thus, in the embodiment shown, the spring plates 30 and 32 are positioned relative to each other in a diametrically opposed, spaced apart, and parallel relationship on opposed longitudinal side faces 12c and 12d of the piezoelectric stack 12.

Each of the spring plates 30 and 32 includes opposed ends coupled to the fingers or hooks 25 formed on each of the respective end cap pieces 24 and 26 of the piezoelectric stack actuator 10.

Still further, each of the spring plates 30 and 32 is formed in a manner including and defining a plurality of columns of closed loops or slots or openings or holes 34 and a plurality of columns of open loops or slots or notches 36 extending along the length and longitudinal axis L of the respective spring plates 30 and 32 in an alternating and staggered relationship. In the embodiment shown, each of the plurality of openings or loops or slots 34 is generally oval in shape and each of the plurality of open loops or slots 36 is generally semi-oval in shape. Moreover, in the embodiment shown, each of the slots 34 and 36 extends on the respective plates 30 and 32 in a relationship perpendicular to the longitudinal axis L of each of the respective plates 30 and 32.

More specifically, each of the spring plates 30 and 32 includes a first vertical column of a plurality of generally oval-shaped and spaced-apart and parallel closed loops or slots or openings or holes 34a extending along the length of and a first vertical edge of each of the spring plates 30 and 32 in a vertical co-linear relationship relative to each other and also a first vertical column of a plurality of generally semi-oval shaped and spaced-apart open loops or slots or notches 36a also extending along the length of the first edge of each of the spring plates 30 and 32 in an vertical co-linear relationship relative to each other and an alternating and staggered relationship relative to the first column of closed loops or slots or openings or holes 34a.

In a similar manner, each of the spring plates 30 and 32 also includes a second vertical column of a plurality of generally oval-shaped and spaced-apart and parallel closed loops or slots or openings or holes 34b extending along the length of and a second opposed vertical edge of each of the spring plates 30 and 32 in a vertical co-linear relationship relative to each other and also defining a second vertical column of a plurality of generally semi-oval shaped and spaced-apart open loops or slots or notches 36b also extending along the length of the second vertical edge of each of the spring plates 30 and 32 in a vertical co-linear relationship relative to each other and an alternating and staggered relationship relative to the second column of closed loops or slots or openings or holes 34b.

The first and second vertical columns of closed loops 34a and 34b and the first and second vertical columns of open loops 36a and 36b are positioned and oriented relative to each other on the respective spring plates 30 and 32 in a side-by-side, alternating, and staggered relationship relative to each other with the loops 34a and 36b positioned in a spaced-apart and horizontal co-linear relationship relative to each other and perpendicular to the plate longitudinal axis L and the loops 36a and 34b positioned in a spaced-apart and horizontal co-linear relationship relative to each other and perpendicular to the plate longitudinal axis.

In accordance with the present invention, the respective projections or fingers 25a and 25b on the respective end caps 24 and 26 receive the respective loops 34a and 36b formed at the opposed distal ends of each of the spring plates 30 and 32 for coupling the respective spring plates 30 and 32 to opposed sides of the piezoelectric stack 12.

The plurality of openings or loops or slots 34 are designed and shaped to provide the required stiffness (under ten percent of the stiffness of the piezoelectric stack 12) and strength (10 Mpa nominal preload pressure on the piezoelectric stack 12).

Currently, the spring plates 30 and 32 are etched as strips greater than 250 mm in length, later cut to the desired length, and hardened for two hours at 315 degrees C.

The manufacture of spring plates 30 and 32 with alternating and staggered openings or loops or slots 34 as described above allows for the spring plates 30 and 32 to be used for differently sized piezoelectric stacks 12 simply by cutting the spring plates 30 and 32 to the desired length and then allowing the openings or loops or slots 34 and 36 defined at the ends of such cut spring plates 30 and 32 to be coupled to the respective fingers or hooks 25 on the respective end caps 24 and 26.

Figure 2:
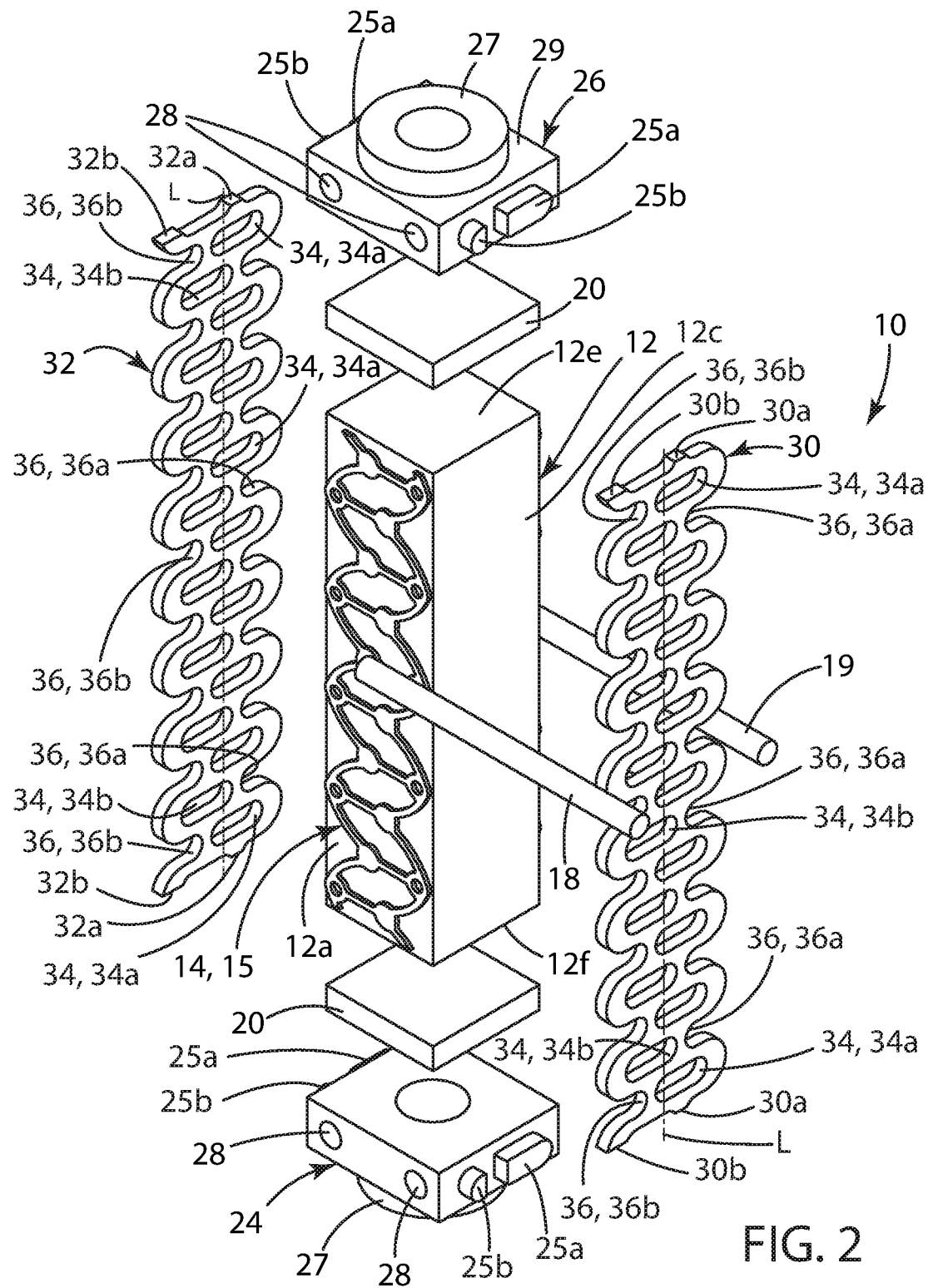
FIG. 2 is an enlarged exploded perspective view of the piezoelectric stack actuator shown in FIG. 1.

Specifically, as shown in FIGS. 1 and 2, the respective cut ends 30a and 30b and 32a and 32b at each end of the spring plates 30 and 32 define the regions or locations at which the respective plates 30 and 32 have been cut by a cutting tool or instrument through respective ones of the closed and open loops 34 and 36 thereof during the assembly process so as to define spring plates 30 and 32 having a length dependent upon and commensurate with the desired end length of the piezoelectric stack 12. Thus, stated another way, it is understood that the respective spring plates 30 and 32 with the respective loops 34 and 36 are initially longer in length than as shown in the FIGS. and subsequently cut to desired length through respective ones of the loops 34 and 36 during the assembly and manufacturing process depending on the desired stack length.

This feature advantageously eliminates the need to manufacture custom spring plates 30 and 32 for each custom actuator 10 and instead allows for the mass manufacture of off-the-shelf spring plates 30 and 32 of a length sufficient to allow the same to be subsequently cut to desired length during the actuator assembly and manufacturing process.

Further, in accordance with the present invention, the combination of spring plates 30 and 32 which are flat and include the plurality of openings or loops or slots 34 and 36 therein define and form spring plates 30 and 32 including the desired and advantageous flexibility and stretching characteristics for pre-loading purposes as described in more detail below.

The process in accordance with the present invention for assembling the preloaded piezoelectric stack 10 will now be described with reference to FIGS. 4A, 4B, 4C, and 4D.

Initially, and as shown in FIG. 4A, the respective end caps 24 and 26 of the piezoelectric stack 10 are connected to the opposed ends 40a and 40b of the preload tool 40.

Thereafter, and also shown in FIG. 4A, the spring plates 30 and 32 are connected to the respective end caps 24 and 26. More specifically, the respective spring plates 30 and 32 are connected to the respective end caps 24 and 26 via the insertion of the respective ones of the loops 34a and 36b defined at the opposed ends of the spring plates 30 and 32 through the respective fingers 25a and 25b projecting from the opposed exterior side surfaces of the respective end caps 24 and 26.

Thereafter, a tensile force is applied to the pre-load tool 40 and, more specifically, to the opposed ends of the pre-load tool 40 which applies a tensile force to the spring plates 30 and 32 that stretches the spring plates 30 and 32 up to about ten percent higher force than required.

As described above, the flat construction of the spring plates 30 and 32 in combination with the loops 34 and 36 defined therein and a pertinent choice of material allows for the desired and required pre-loading and stretching of the material of the spring plates 30 and 32.

Thereafter, and as shown in FIG. 4B, the piezoelectric stack 12 is inserted into the tool 40 and, more specifically, is inserted into the tool 40 in a relationship located between the spring plates 30 and 32 in the horizontal side-to-side direction and between the end caps 24 and 26 in the vertical direction.

Thereafter, as shown in FIG. 4C, and depending upon the desired preload force, one or more inactive ceramic plates 20 of the same or different thicknesses may be inserted into the tool 40 and, more specifically, are inserted between the bottom or lower end of the piezoelectric stack 12 and the bottom or lower end cap 24 and then one or more inactive ceramic plates 20 of the same or different thicknesses may be are inserted into the tool 40 and, more specifically, are inserted between the top or upper end of the stack 12 and the top or upper end cap 26 in order to bridge the gap and space between the top or upper end of the stack 12 and the top or upper end cap piece 26.

Thereafter, the force applied by the tool 40 and, more specifically, the tensile pre-load stretching force applied to the spring plates 30 and 32 is released and the pre-loaded piezoelectric stack actuator 10, including the spring pre-loaded/pre-stretched plates 30 and 32, the stack 12, inactive ceramic plates 20, and end cap pieces 24 and 26, is removed from the tool 40 so as to define and form the pre-loaded piezoelectric stack actuator 10 of the present invention.

Numerous variations and modifications of the pre-loaded piezoelectric stack actuator described above may be effected without departing from the spirit and scope of the novel features of the invention. It is to be understood that no limitations with respect to the specific piezoelectric stack actuator described herein are intended or should be inferred. It is, of course, intended to cover by the appended claims all such modifications as fall within the scope of the claims.

What is claimed is:

1. A pre-loaded piezoelectric stack actuator comprising:
a piezoelectric stack;
a first electrode on a first side of the piezoelectric stack;
a second electrode on a second side of the piezoelectric stack opposite the first side of the piezoelectric stack;
first and second end caps at opposed first and second ends of the piezoelectric stack;
one or more first plates stacked between the first end cap and the first end of the piezoelectric stack;
one or more second plates stacked between the second end cap and the second end of the piezoelectric stack;
a first spring plate on a third side of the piezoelectric stack and including opposed ends coupled to a first side of the first and second end caps, the first spring plate being elongate and pre-loaded and defining one or more slots; and
a second spring plate on a fourth side of the piezoelectric stack opposite the third side of the piezoelectric stack and including opposed ends coupled to a second side of the first and second end caps opposite the first side of the first and second end caps, the second spring plate being elongate and pre-loaded and defining one or more slots.

2. The pre-loaded piezoelectric stack actuator of claim 1 wherein each of the first and second spring plates defines a longitudinal axis and a column of a plurality of the slots extend along the longitudinal axis.

3. The pre-loaded piezoelectric stack actuator of claim 1 wherein each of the first and second end caps includes a finger on opposed exterior side faces thereof, the finger extending into the one of the slots located at each of the opposed ends of each of the first and second spring plates for coupling the first and second spring plates and the first and second end caps to the piezoelectric stack.

4. The pre-loaded piezoelectric stack actuator of claim 1 wherein each of the first and second spring plates includes a plurality of closed slots and open slots extending along a longitudinal axis thereof and each of the first and second end caps includes first and second fingers extending into one of the closed slots and one of the open slots respectively at each end of each of the first and second spring plates for coupling the first and second spring plates and the first and second end caps to the piezoelectric stack.

5. The pre-loaded piezoelectric stack actuator of claim 4 wherein the first and second fingers are positioned on the first and second spring plates in a spaced-apart and co-linear relationship and the one of the closed slots and the one of the open slots at each end of each of the first and second spring plates are positioned in a spaced-apart and co-linear relationship.

6. The pre-loaded piezoelectric stack actuator of claim 1 wherein each of the first and second spring plates defines a longitudinal axis and including first and second columns of closed slots and open slots extending along the longitudinal axis, the closed slots extending in a spaced-apart and vertical co-linear relationship relative to each other, the open slots in each of the first and second columns extending in a spaced-apart and vertical relationship relative to each other and in an alternating and spaced-apart relationship relative to the closed slots, and the closed slots in the first column extending in a side-by-side and horizontal co-linear relationship with the open slots in the second column.

7. A pre-loaded piezoelectric stack actuator comprising:
a piezoelectric stack including opposed first and second exterior side faces;
first and second end caps at opposed first and second end faces of the piezoelectric stack, each of the first and second end caps including a pair of first and second fingers projecting outwardly therefrom;
a first spring plate extending opposite the first exterior side face of the piezoelectric stack, the first spring plate being elongate and pre-stretched and defining first and second columns of closed and open slots, one of the pairs of the first and second fingers on each of the first and second end caps extending into respective ones of the closed and open slots defined at opposed ends of the first spring plate respectively for coupling the first spring plate to the first and second end caps; and
a second spring plate extending opposite the second exterior side face of the piezoelectric stack, the second spring plate being elongate and pre-stretched and defining first and second columns of closed and open slots, the other of the pairs of the first and second fingers on each of the first and second end caps extending into respective ones of the closed and open slots defined at opposed ends of the second spring plate respectively for coupling the first spring plate to the first and second end caps.

8. The pre-loaded piezoelectric stack actuator of claim 7 further comprising first and second electrodes formed on third and fourth exterior side faces of the piezoelectric stack.

9. The pre-loaded piezoelectric stack actuator of claim 7 wherein the first and second columns of closed slots and open slots extend along a longitudinal axis of the first and second spring plates, the closed slots and open slots in each of the first and second columns extending in an alternating, spaced-apart and vertical co-linear relationship relative to each other and perpendicular to the longitudinal axis of the first and second spring plates, and the closed slots in the first column extending in a side-by-side and horizontal co-linear relationship with the open slots in the second column.

10. A method of pre-loading a piezoelectric stack actuator including a piezoelectric stack having opposed first and second ends, first and second caps, a plurality of insulative plates of equal or unequal thickness, and first and second spring plates each defining a plurality of slots, the method comprising the steps of:
providing a pre-load tool including opposed first and second ends;
connecting the first and second caps to the opposed first and second ends of the pre-load tool;
connecting the first and second spring plates between the first and second caps connected to the opposed first and second ends of the pre-load tool;
applying a tensile force to the opposed first and second ends of the pre-load tool to stretch the first and second spring plates;
inserting the piezoelectric stack into the pre-load tool between the first and second caps and the first and second spring plates;
inserting one or more of the plurality of insulative plates between the first cap and the first end of the piezoelectric stack;
inserting one or more of the plurality of insulative plates between the second cap and the second end of the piezoelectric stack;
releasing the tensile force applied to the pre-load tool; and
removing the piezoelectric stack actuator from the pre-load tool.

11. The method of claim 10 wherein each of the first and second caps includes a finger projecting from opposed exterior side faces thereof and the step of connecting the first and second spring plates to the first and second caps comprises the step of inserting the finger on the first and second caps into respective ones of the plurality of slots in each of the first and second spring plates.

12. The method of claim 11 wherein each of the first and second caps includes a pair of first and second fingers projecting from the opposed exterior side faces thereof and the first and second spring plates include opposed ends and first and second columns of closed and open slots, the step of connecting the first and second spring plates to the first and second caps comprises the step of inserting the pairs of the first and second fingers on each of the first and second caps extending into respective ones of the closed and open slots defined at the opposed ends of the first and second spring plates respectively.

13. The method of claim 12 wherein the first and second columns of closed slots and open slots extend along a longitudinal axis of the first and second spring plates, the closed slots and open slots in each of the first and second columns extending in an alternating, spaced-apart and vertical co-linear relationship relative to each other, and the closed slots in the first column extending in a side-by-side and horizontal co-linear relationship with the open slots in the second column.

\* \* \* \* \*